(12) United States Patent
Liu et al.

(10) Patent No.: US 8,329,567 B2
(45) Date of Patent: Dec. 11, 2012

(54) METHODS OF FORMING DOPED REGIONS IN SEMICONDUCTOR SUBSTRATES

(75) Inventors: Jennifer Lequn Liu, Boise, ID (US); Shu Qin, Boise, ID (US); Allen McTeer, Boise, ID (US); Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 12/938,845

(22) Filed: Nov. 3, 2010

(65) Prior Publication Data

US 2012/0108042 A1 May 3, 2012

(51) Int. Cl.
*H01L 21/26* (2006.01)
*H01L 21/42* (2006.01)

(52) U.S. Cl. .. 438/513; 438/536; 438/914; 257/E21.338

(58) Field of Classification Search ............ 438/520, 438/510, 513, 514, 536, 914; 257/E21.338
See application file for complete search history.

(56) References Cited

U.S. PATENT DOCUMENTS

| | | | |
|---|---|---|---|
| 3,562,022 A * | 2/1971 | Shifrin | 438/536 |
| 3,865,624 A * | 2/1975 | Wilde | 438/635 |
| 4,764,394 A | 8/1988 | Conrad | |
| 5,374,456 A | 12/1994 | Matossian et al. | |
| 5,672,541 A | 9/1997 | Booske et al. | |
| 5,897,363 A | 4/1999 | Gonzalez et al. | |
| 6,137,713 A | 10/2000 | Kuroda et al. | |
| 6,417,040 B2 | 7/2002 | Noble | |
| 6,492,245 B1 | 12/2002 | Liu et al. | |
| 6,504,201 B1 | 1/2003 | Noble et al. | |
| 6,563,162 B2 | 5/2003 | Han et al. | |
| 6,593,612 B2 | 7/2003 | Gruening et al. | |
| 6,600,191 B2 | 7/2003 | Lowrey et al. | |
| 6,639,846 B2 | 10/2003 | Nikutta | |
| 6,689,660 B1 | 2/2004 | Noble et al. | |
| 6,716,727 B2 | 4/2004 | Walther | |
| 7,052,941 B2 | 5/2006 | Lee | |
| 7,074,656 B2 | 7/2006 | Yeo et al. | |
| 7,179,703 B2 | 2/2007 | Gonzalez et al. | |
| 7,365,384 B2 | 4/2008 | Tran et al. | |
| 7,456,068 B2 | 11/2008 | Kavalieros et al. | |
| 7,491,641 B2 | 2/2009 | Southwick et al. | |
| 7,501,676 B2 | 3/2009 | Doyle | |
| 7,592,212 B2 | 9/2009 | Qin et al. | |
| 7,737,010 B2 | 6/2010 | Qin et al. | |
| 7,768,073 B2 | 8/2010 | Wells | |
| 7,939,409 B2 | 5/2011 | Figura et al. | |
| 2003/0096490 A1 | 5/2003 | Borland et al. | |

(Continued)

OTHER PUBLICATIONS

Gras-Marth, "Recoil Implantation Yields and Depth Profiles", phys. stat. sol. (a) 76, 621-627 (1983).*

(Continued)

*Primary Examiner* — Leonard Chang
(74) *Attorney, Agent, or Firm* — Wells St. John.P.S.

(57) ABSTRACT

Some embodiments include methods of forming one or more doped regions in a semiconductor substrate. Plasma doping may be used to form a first dopant to a first depth within the substrate. The first dopant may then be impacted with a second dopant to knock the first dopant to a second depth within the substrate. In some embodiments the first dopant is p-type (such as boron) and the second dopant is neutral type (such as germanium). In some embodiments the second dopant is heavier than the first dopant.

6 Claims, 3 Drawing Sheets

U.S. PATENT DOCUMENTS

2003/0186519 A1 10/2003 Downey et al.
2005/0260838 A1* 11/2005 Downey et al. ............... 438/527
2007/0087574 A1* 4/2007 Gupta et al. ................. 438/758
2008/0142931 A1 6/2008 Sasaki et al.

OTHER PUBLICATIONS

Bernstein et al., "Effects of Dopant Deposition on p+/n and n+/p Shallow Junctions formed by Plasma Immersion Ion Implantation", IEEE, 2000, Conf. on Ion Implantation Technology, 464-467.*

U.S. Appl. No. 12/917,346, filed Nov. 1, 2010 by Lars Heineck.
U.S. Appl. No. 13/031,829, filed Feb. 22, 2011 by Jaydip Guha.
Oh et al., "Characterization of B2H6 Plasma Doping for Converted p+ Poly-Si Gate", Ion Implantation Technology, 2006, pp. 25-28.
Qin et al., "Comparative Study of Self-Sputtering Effects of Different Boron-Based Low-Energy Doping Techniques", IEEE, 2009, pp. 1760-1766.

* cited by examiner

METHODS OF FORMING DOPED REGIONS IN SEMICONDUCTOR SUBSTRATES

TECHNICAL FIELD

Methods of forming doped regions in semiconductor substrates.

BACKGROUND

Integrated circuit fabrication may involve implanting one or more dopants into a semiconductor substrate. One method for implanting dopant into the substrate is beamline ion implantation. Such method can utilize high energy to implant ions deeply into a substrate. However, as semiconductor devices become increasingly smaller (i.e., as a level of integration increases) multiple problems are encountered in attempting to utilize beamline ion implantation. Such problems include fundamental physical limits pertaining to the space charge limit, sputtering limit, and the implant angle limit for non-planar structures.

Another method for implanting dopant into a semiconductor substrate is plasma doping (PLAD), which may be also referred to as plasma immersion ion implantation (PIII). PLAD may offer advantages relative to beamline ion implantation such as system simplicity, lower-cost and higher throughput; and further may not be adversely affected by the fundamental physical limits that reduce the scalability of beamline ion implantation. However, PLAD can suffer from a disadvantage in that it is difficult to implant dopant deeply into a substrate. Further, PLAD often forms an undesired deposit across a substrate surface. The deposit can be removed with a subsequent clean, but such clean can exacerbate the problem of the shallow dopant implant occurring with PLAD. Specifically, the clean may remove some of the substrate from over the implant region and thereby render the implant to be even more shallow relative to an upper substrate surface.

In light of the above-discussed difficulties associated with conventional dopant implant methodologies, it would be desirable to develop new methods for implanting dopants into semiconductor substrates during integrated circuit fabrication.

DETAILED DESCRIPTION OF THE ILLUSTRATED EMBODIMENTS

In some embodiments doping methodologies comprise utilization of PLAD to provide a first dopant within a substrate to an initial depth, followed by utilization of a second dopant to knock the first dopant deeper into the substrate. The energy of the second dopant may be sufficient to knock first dopant out of a PLAD deposition layer and into an underlying substrate, but low enough that the second dopant remains primarily within the PLAD deposition layer, and/or near an interface of the deposition layer and an underlying substrate, so that the most, if not all, of the second dopant is removed with a subsequent clean step utilized to remove the PLAD deposition layer. In some embodiments the PLAD deposition layer is advantageously utilized as a screen to reduce or eliminate damage to the underlying substrate from the implant of the second dopant. In some embodiments the second dopant is implanted at an appropriate energy and dose so that the majority of the second dopant remains within the deposit. The second dopant may be elements, molecules or clusters.

The second dopant may be implanted by, for example, PLAD and/or ion bombardment (where ion bombardment refers to beamline ion implantation, or to other ion implantation conducted in the absence of plasma). The first dopant provided in the substrate with PLAD may be any of numerous dopants, including n-type dopants (for instance, phosphorus, arsenic, etc.) and p-type dopants (for instance, boron, etc.). In a specific example described herein, the first dopant is boron implanted utilizing PLAD with $B_2H_6$. The second dopant utilized to knock the first dopant deeper into the substrate may be any suitable particles, including, for example, n-type dopants, p-type dopants and/or neutral type dopants (for instance, carbon, silicon, germanium, etc.). Further, the second dopant may be heavier than the first dopant or lighter than the first dopant, provided that the overall energy of the second dopant is sufficient to knock the first dopant deeper into the substrate. In a specific example described herein, the second dopant is neutral-type dopant (specifically, germanium) and heavier than the first dopant.

An example embodiment is described with reference to FIGS. 1-4. The example embodiment utilizes PLAD to form boron-doped regions, and then utilizes beamline ion implantation of germanium to knock the boron dopant deeper into a semiconductor substrate.

Figure 1:
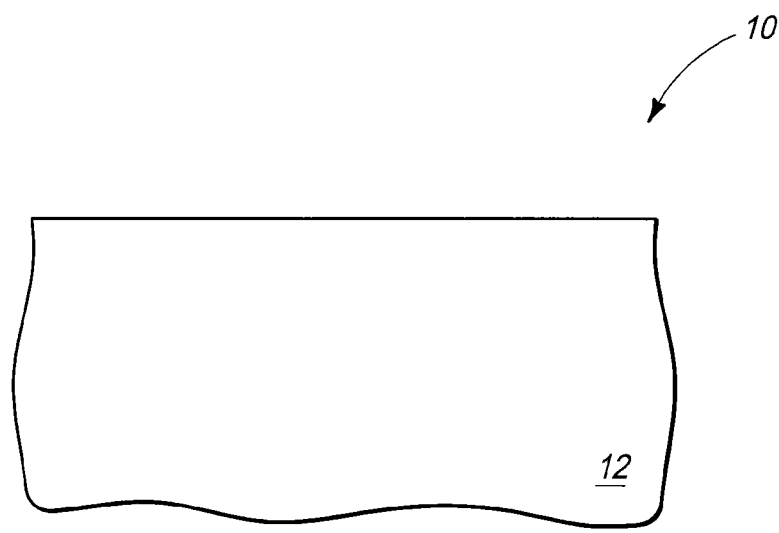
FIGS. 1-4 are diagrammatic cross-sectional views of a portion of a semiconductor construction at various process stages of an example embodiment.

FIG. 1 shows a portion of a semiconductor construction 10 at a preliminary processing stage. The construction includes a semiconductor base 12. Base 12 may comprise, consist essentially of or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

Figure 2:
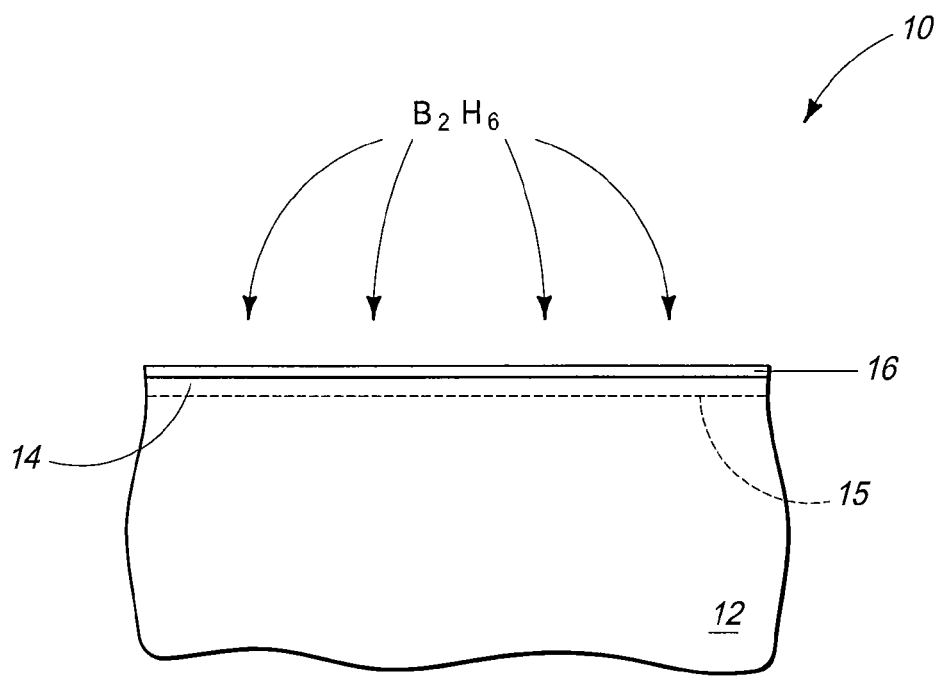

Referring to FIG. 2, $B_2H_6$ is utilized in a PLAD process to form boron dopant to a first depth within substrate 12, and to thus form a boron-doped region 14 within the semiconductor substrate 12. The first depth of the boron dopant is diagrammatically illustrated with a dashed line 15. In some embodiments the $B_2H_6$ may be considered to be a dopant precursor comprising boron as a primary element, with such "primary element" corresponding to the feature element of the dopant precursor. The precursor $B_2H_6$ is one of numerous precursors that may be utilized for implanting desired dopants in PLAD processes, and other precursors may be utilized in other embodiments.

The PLAD system may be an RF-excited continuous plasma with a DC pulsed bias substrate. Such doping system may utilize a doping gas of $B_2H_6/H_2$ with an implant voltage that may be typically within a range of from 0 to −15 KV, and with a dose that may be typically within a range of from about $1 \times 10^{16}$ atoms/cm$^2$ to about $1 \times 10^{17}$ atoms/cm$^2$ (for instance, about $3.5 \times 10^{16}$ atoms/cm$^2$).

In the shown embodiment of FIG. 2, the PLAD forms a deposit 16 across an upper surface of substrate 12. Such is common in PLAD processes, and the deposit may be subsequently removed with an appropriate clean (discussed below with reference to FIG. 4). In some embodiments, the deposit 16 may be used as a screen layer to protect the substrate 12 during a subsequent implant of a second dopant (discussed below with reference to FIG. 3).

A significant amount of the deposited boron provided by PLAD processing may be within the layer 16, as well as within upper surface layers of substrate 12 that will ultimately be removed in the subsequent clean. Accordingly, less than or equal to about 50 percent of the total implanted boron dose may be deep enough within substrate 12 at the processing stage of FIG. 2 to avoid being removed in the subsequent clean.

Figure 3:
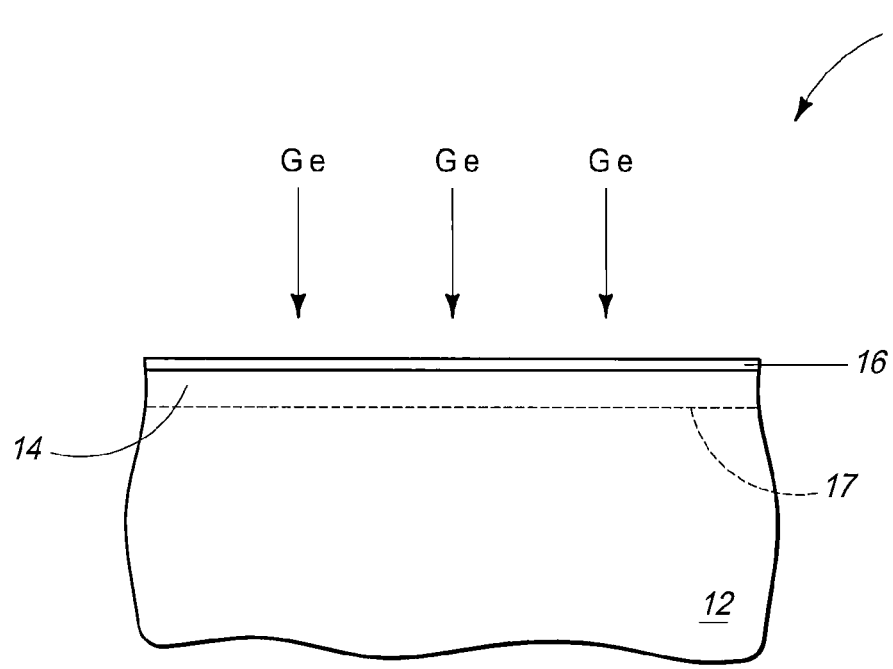

Referring to FIG. 3, a second dopant, such as a neutral-type dopant (specifically germanium in the shown embodiment), is utilized to knock boron deeper within the boron-doped region 14, and thus to extend a depth of the boron-doped region down to the depth diagrammatically illustrated with a dashed line 17. The germanium may be implanted with any suitable processing, including, for example, PLAD or ion bombardment (with "ion bombardment" referring to ion implanting in the absence of plasma, and in some embodiments referring to ion beamline implanting). Accordingly, the germanium may be implanted utilizing precursor corresponding to germanium ions, or corresponding to molecules containing germanium mixed with other elements. Regardless, the precursor may be considered to comprise a primary element corresponding to germanium, with the term "primary element" referring to the feature element of the dopant precursor.

The germanium implant can be utilized to move at least some of the boron within doped region 14 to a desired depth within substrate 12. Also, the germanium implant can increase the amount of boron that remains within substrate 12 after a subsequent clean (such clean is discussed below with reference to FIG. 4). Specifically, the germanium can knock boron from the deposit 16 into substrate 12 as the germanium penetrates through deposit 16. Also, the germanium can knock boron from upper regions of substrate 12 (i.e., regions that may be removed by a subsequent clean) into lower regions (i.e., regions that remain after the subsequent clean). In some embodiments the boron is preferred to knock into the upper portion of the lower regions to improve contact resistance reduction and provide more dopant for activation as long as they are below B solid state solubility.

In some embodiments the germanium can be implanted deep enough to remain in a doped region after a subsequent clean of the PLAD deposit 16, and can have an additional advantage of enhancing boron activation during a subsequent anneal. In other embodiments, all of the germanium may be removed in a subsequent clean utilized to remove the PLAD deposit.

An example method for providing the germanium implant of FIG. 3 is to utilize a Ge+ ion beamline implant with an energy of less than or equal to about 10 KeV and a dose in a range of from about $1 \times 10^{15}$ atoms/cm$^2$ to about $1 \times 10^{16}$ atoms/cm$^2$ (for instance, about $6 \times 10^{15}$ atoms/cm$^2$).

Figure 4:
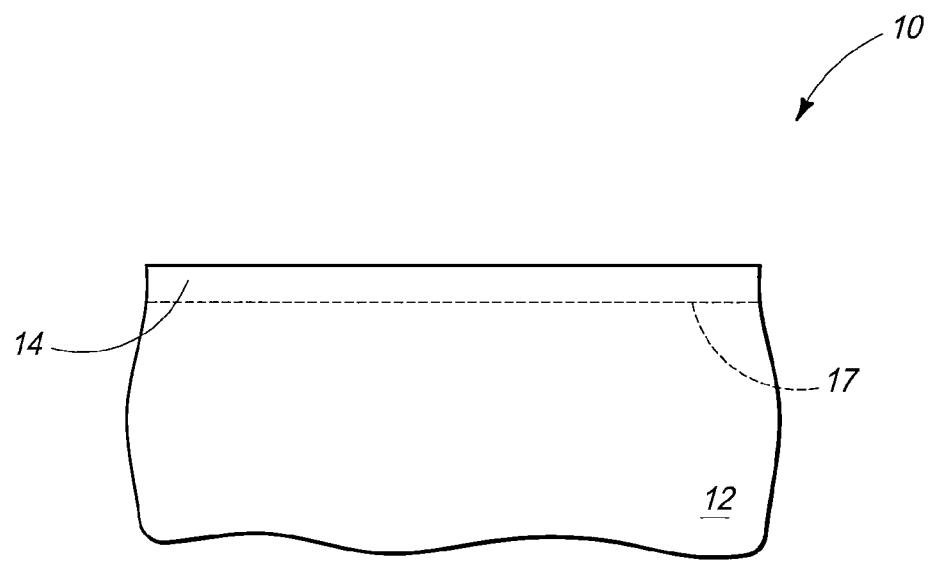

Referring to FIG. 4, construction 10 may be subjected to a subsequent clean to remove deposit 16 (FIG. 3). Such clean may be, for example, a conventional rinse/strip/clean utilized subsequently to $B_2H_6$-based PLAD.

Figure 5:
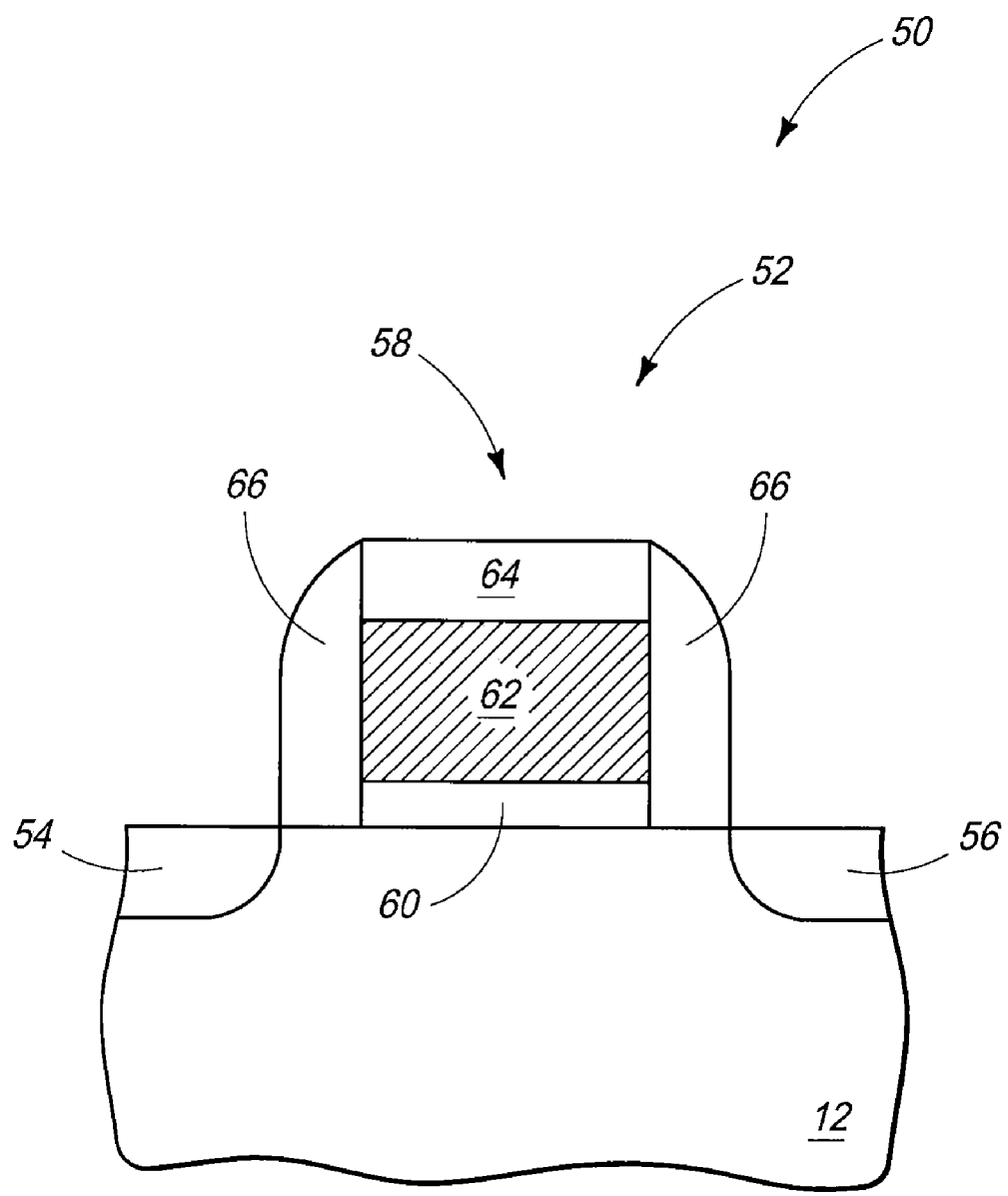
FIG. 5 is a diagrammatic cross-sectional view of a portion of a semiconductor substrate at a process stage of an example embodiment.

The processing of FIGS. 1-4 may be utilized to form doped regions for any of numerous applications. For instance, the processing may be utilized to form boron-doped source/drain regions associated with volatile memory (e.g., DRAM) or nonvolatile memory (e.g., NAND). FIG. 5 shows a construction 50 illustrating an example transistor 52 comprising source/drain regions 54 and 56 that may be formed utilizing processing of the type described above with reference to FIGS. 1-4. The source/drain regions 54 and 56 extend into substrate 12. The transistor 52 includes a gate stack 58 comprising, in ascending order from substrate 12, a gate dielectric 60, an electrically conductive gate material 62, and an electrically insulative cap 64. The gate dielectric may comprise any suitable composition or combination of compositions, and in some embodiments may comprise, consist essentially of or consist of silicon dioxide. The electrically conductive gate material may comprise any suitable composition or combination of compositions, and in some embodiments may comprise one or more of various metals, metal-containing substances, and conductively-doped semiconductor materials. The electrically insulative cap may comprise any suitable composition or combination of compositions, and in some embodiments may comprise, consist essentially of, or consist of one or more of silicon dioxide, silicon nitride and silicon oxynitride.

Sidewall spacers 66 are along sidewalls of the gate stack 58. The sidewall spacers may comprise any suitable composition or combination of compositions, and in some embodiments may comprise, consist essentially of, or consist of one or more of silicon dioxide, silicon nitride and silicon oxynitride.

Source/drain regions 54 and 56 are aligned relative to sidewall spacers 66. In some embodiments the source/drain regions may comprise halo regions (not shown) and/or lightly doped diffusion (LDD) regions (not shown) that extend to under spacers 66.

Although the example embodiment of FIGS. 1-4 utilized p-type dopant (specifically boron) as the first dopant and neutral-type dopant (specifically germanium) as the second dopant, other embodiments may utilize other types of dopants for either the first or second dopants. For instance, the first dopant utilized at the processing stage of FIG. 2 may be n-type dopant (for example, phosphorus or arsenic), or neutral-type dopant (for instance, carbon, silicon or germanium) in some embodiments. Also, the second dopant utilized at the processing stage of FIG. 3 may be p-type dopant or n-type dopant in some embodiments, rather than the shown neutral-type dopant. Further, the second dopant may be elements, molecules or clusters.

In the shown embodiment, the second dopant utilized at the process stage of FIG. 3 is heavier than the first dopant utilized at the processing stage of FIG. 2. It can be advantageous to utilize a heavy dopant as the second dopant in order to readily have enough momentum within such second dopant to knock the first dopant deeper within a doped region in a semiconductor substrate. However, light dopants may also be utilized as the second dopants, provided that such light dopants have enough velocity to create sufficient momentum to knock a first dopant deeper within a doped region in a semiconductor substrate.

The utilization of a second dopant to knock the first plasma-deposited dopant deeper into a semiconductor substrate is found to improve sheet resistance, contact resistance and device performance relative to the utilization of plasma deposition alone.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a doped region in a semiconductor substrate comprising:
   plasma doping of the substrate to form a first dopant to a first depth within the substrate; wherein the plasma doping forms a deposit across an upper surface of the substrate; wherein the first dopant comprises boron;
   impacting the first dopant with germanium to knock some of the first dopant out of the deposit and into the substrate while using the deposit as a screen to protect the underlying substrate from any penetration by the germanium; wherein the impacting comprises ion beamline implanting of the germanium utilizing an energy and dose of the germanium which keeps all of the germanium in the deposit; and
   cleaning the substrate; the cleaning removing the deposit and all of the germanium to leave a doped region comprising the first dopant and none of the germanium.

2. The method of claim 1 wherein the plasma doping utilizes $B_2H_6$.

3. A method of forming a doped region in a semiconductor substrate comprising:
   plasma doping of the substrate to form a first dopant to a first depth within the substrate; wherein the plasma doping forms a deposit across an upper surface of the substrate;
   ion bombarding a second dopant into the substrate without a plasma to knock first dopant out of the deposit and into the substrate; the first dopant comprising a first primary element and the second dopant comprising a second primary element different from the first primary element, and heavier than the first primary element; wherein the first primary element is p-type, and wherein the second primary element is neutral-type;
   using the deposit as a screen to protect the underlying substrate from any penetration by the second dopant; the ion bombarding being conducted under conditions which keep all of the second dopant in the deposit; and
   cleaning the substrate; the cleaning removing the deposit and all of the second dopant to leave a doped region comprising the first dopant and none of the second dopant;
   wherein the first primary element is boron, and wherein the second primary element is germanium.

4. The method of claim 3 wherein the plasma doping utilizes $B_2H_6$.

5. A method of forming a doped region in a semiconductor substrate comprising:
   plasma doping of the substrate with a boron-containing material to form boron dopant to a first depth within a monocrystalline silicon substrate; wherein the plasma doping forms a deposit across an upper surface of the substrate;
   ion bombarding a neutral-type dopant into the substrate without a plasma to knock boron dopant out of the deposit and into the monocrystalline silicon substrate; the neutral-type dopant being heavier than boron;
   using the deposit as a screen to protect the underlying monocrystalline silicon substrate from any penetration by the neutral-type dopant; the ion bombarding being conducted under conditions which keep all of the neutral-type dopant in the deposit; and
   cleaning the substrate; the cleaning removing the deposit and the neutral-type dopant to leave a doped region comprising the boron dopant and none of the neutral-type dopant;
   wherein the neutral-type dopant is germanium.

6. The method of claim 5 wherein the boron-containing material is $B_2H_6$.

* * * * *